(12) United States Patent
Feurle

(10) Patent No.: US 6,700,831 B2
(45) Date of Patent: Mar. 2, 2004

(54) INTEGRATED MEMORY HAVING A PLURALITY OF MEMORY CELL ARRAYS AND METHOD FOR OPERATING THE INTEGRATED MEMORY

(75) Inventor: Robert Feurle, Neubiberg (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/054,613

(22) Filed: Jan. 22, 2002

(65) Prior Publication Data

US 2002/0110043 A1 Aug. 15, 2002

(30) Foreign Application Priority Data

Jan. 19, 2001 (DE) .......................... 101 02 350

(51) Int. Cl.7 ................................. G11C 8/00
(52) U.S. Cl. ................ 365/230.03; 365/191; 365/236
(58) Field of Search ............... 365/230.03, 236, 365/191, 189.01, 230.01

(56) References Cited

U.S. PATENT DOCUMENTS 6,181,631 B1 * 1/2001 Nobutoki et al. ...... 365/230.03
6,333,894 B1 * 12/2001 Nakayama et al. ......... 365/233
6,385,125 B1 * 5/2002 Ooishi et al. ............... 365/233

OTHER PUBLICATIONS

Intel: "MCS–80/85™ Family User's Manual", Oct. 1979, pp. 6–32–6–36.
Paul Watkins: "Burst EDO—a new DRAM standard", Electronic Engineering, Jun. 1995, pp. 89–90.
Marc Haberland: "Synchrone Spitzenleistung (Teil 1)" [synchronous peak performance], Design & Elektronik No. 21, Oct. 15, 1996, pp. 59–61.

* cited by examiner

Primary Examiner—Hoai Ho
(74) Attorney, Agent, or Firm—Laurence A. Greenberg; Werner H. Stemer; Gregory L. Mayback

(57) ABSTRACT

An integrated memory has a plurality of memory cell arrays. The memory cell arrays are in each case assigned a decoder for selecting bit lines and word lines. In order to trigger an access cycle for a memory cell access, a write command or a read command with an active state is generated. Within the access cycle, under the control of a control circuit, respective decoders of the memory cell arrays are driven and data of each of the memory cell arrays are successively read out or written in for as long as the read command or write command remains in the active state. As a result, it is possible to set a comparatively large variable burst length of the memory. A method for operating an integrated memory is also provided.

7 Claims, 3 Drawing Sheets

INTEGRATED MEMORY HAVING A PLURALITY OF MEMORY CELL ARRAYS AND METHOD FOR OPERATING THE INTEGRATED MEMORY

BACKGROUND OF THE INVENTION

Field of the Invention

The invention relates to an integrated memory having a plurality of memory cell arrays, which each have word lines for selecting memory cells and bit lines for reading or writing data signals of the memory cells. The invention also relates to a method for operating the integrated memory.

An integrated memory generally has one or more memory cell arrays each including bit lines and word lines. In this case, the memory cells are provided at crossover points between the bit lines and the word lines. The memory cells are in each case connected to one of the word lines. In order to select a memory cell, in the case of a DRAM (Dynamic Random Access Memory), for example, selection transistors of memory cells are turned on by an activated word line, as a result of which a data signal of a corresponding selected memory cell can subsequently be read out or written. To that end, the selected memory cell is connected via the selection transistor to one of the bit lines, via which the corresponding data signal is read out or written in.

For a memory cell access, usually a plurality of memory cells are read from or written to within an access cycle. By way of example, a number or all of the memory cells along an activated word line are read from or written to. Such a memory cell access is generally referred to as a so-called burst and the number of selected memory cells or the number of read-out or write steps to be performed within an access cycle is referred to as the burst length. At the beginning of the access, a start address is applied to the memory and the access to the memory cells that are to be addressed within a burst is controlled internally without a new address in each case being applied to the memory.

The burst length is usually programmed in a so-called mode register. In an access cycle, a respective decoder which is assigned to a memory cell array is addressed for the selection of a word line and a number of bit lines (depending on the burst length). The decoder carries out the actions of activation, reading or writing and precharging, or selects the relevant word line and relevant bit lines therefor. After such an access, for a new memory cell access, a new word line is addressed and the actions described are in each case carried out anew. As a result, a burst length is generally limited to the length of the selected word line, the so-called page length of the memory.

SUMMARY OF THE INVENTION

It is accordingly an object of the invention to provide an integrated memory which overcomes the above-mentioned disadvantages of the heretofore-known memory devices of this general type and which allows to set a comparatively large variable burst length of the memory. Furthermore, it is an object of the invention to provide a method for operating an integrated memory that makes it possible to have a comparatively large variable burst length of the memory, in the case of a memory cell access.

With the foregoing and other objects in view there is provided, in accordance with the invention, an integrated memory, including:

a plurality of memory cell arrays each having memory cells, word lines for selecting the memory cells, and bit lines for reading data signals from the memory cells or writing data signals to the memory cells;

decoders assigned to respective ones of the memory cell arrays for selecting the bit lines and the word lines;

a terminal for receiving a read command or a write command, the read command and the write command having a respective state;

a control circuit for controlling a memory cell access, the control circuit being connected to the decoders and to the terminal for receiving a read command or a write command;

the control circuit generating, in dependence of the respective state of the read command or the write command, first control signals for driving one of the decoders assigned to one of the memory cell arrays and second control signals for driving a further one of the decoders assigned to a further one of the memory cell arrays within an access cycle; and the control circuit being configured such that a generation of the first and second control signals by the control circuit is terminated by the read command or the write command.

In other words, the object of the invention is achieved by an integrated memory in which the memory cell arrays are in each case assigned a decoder for the selection of bit lines and word lines, a control circuit, which is connected to the respective decoders of the memory cell arrays and to a terminal for a read command or a write command, in which, for a memory cell access, the control circuit, depending on a state of the read command or write command can generate first control signals for driving the decoder of one of the memory cell arrays and second control signals for driving the decoder of a further memory cell array within an access cycle, and in which the generation of the control signals by the control circuit is terminated by the read command or write command.

With the objects of the invention in view there is also provided, a method for operating an integrated memory, the method includes the steps of:

providing an integrated memory having a plurality of memory cell arrays each having word lines for selecting memory cells and bit lines for reading or writing data signals of the memory cells;

generating a write command having an active state or a read command having an active state in order to trigger an access cycle for a memory cell access;

driving respective decoders of the memory cell arrays within the access cycle for the memory cell access; and successively reading data from each of the memory cell arrays or successively writing data to each of the memory cell arrays for as long as the command remains in the active state.

In other words, the object of the invention is achieved by a method for operating an integrated memory having a plurality of memory cell arrays, which each have word lines for the selection of memory cells and bit lines for reading out or writing data signals of the memory cells, in which a write command or read command with an active state is generated in order to trigger an access cycle for a memory cell access, in which, for a memory cell access, within the access cycle respective decoders of the memory cell arrays are driven and data of each of the memory cell arrays are successively read out or written in for as long as the read command or write command remains in the active state.

The invention makes it possible to set comparatively large burst lengths of the memory for a memory cell access. To that end, provision is made of a plurality of memory cell arrays, for example in the form of memory banks, which are driven in so-called multi-memory-bank operation. This makes it possible to carry out a burst over all the memory cell arrays of the integrated memory. With this functionality, it is possible, in principle, to carry out bursts of virtually arbitrary length. The respective read command or write command is used to determine the burst length. This is achieved in that the data of each of the memory cell arrays are successively read out or written in for as long as the read command or write command remains in the active state. As soon as the read command or write command undergoes transition into an inactive state, the respective burst is ended. Accordingly, the control circuit is connected to the terminal for the read command or the write command, so that it can be indicated to the control circuit when the read or write access is ended. In this case, the generation of the control signals for driving the respective decoders is ended.

According to one embodiment of the integrated memory, the control circuit contains a counter circuit, which can be driven by the write command or read command. By way of example, the counter circuit generates the second control signals sequentially after the first control signals. Thus, firstly a burst is carried out at one of the memory cell arrays before the burst is continued at a further memory cell array.

As an alternative to this, it is possible for the counter circuit to generate the first control signals and second control signals alternately. The memory cell arrays are thus accessed in so-called interleave operation. Accordingly, data from a first memory cell array and data from a second memory cell array are read out or written in in an alternating order, whereas in the case of the sequential order described above, firstly data from a first memory cell array and then data from a second memory cell array are read out or written in.

Other features which are considered as characteristic for the invention are set forth in the appended claims.

Although the invention is illustrated and described herein as embodied in a integrated memory having a plurality of memory cell arrays and a method for operating the integrated memory, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
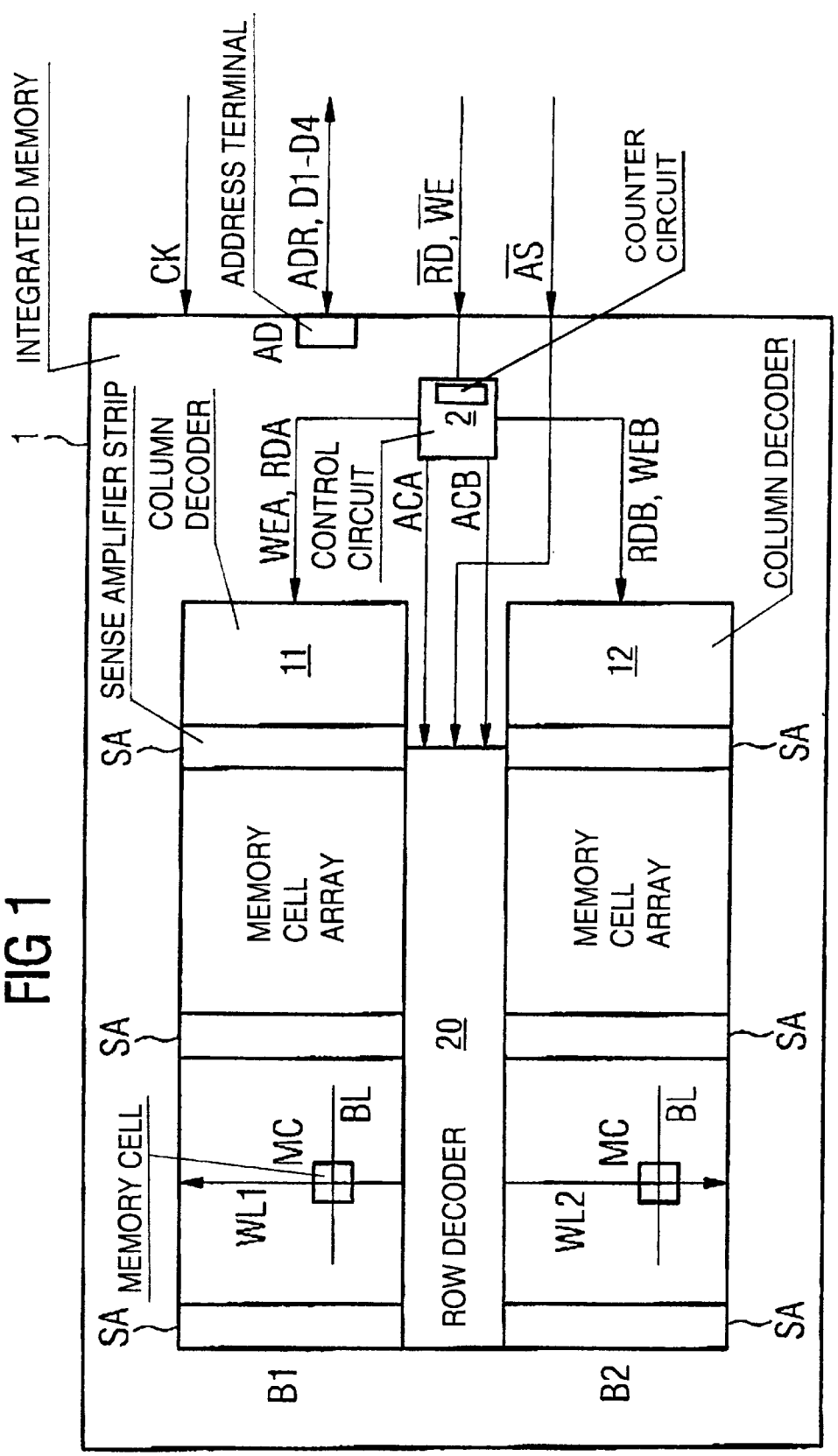
FIG. 1 is a block diagram of an exemplary embodiment of an integrated memory according to the invention.

Referring now to the figures of the drawings in detail and first, particularly, to FIG. 1 thereof, there is shown an exemplary embodiment of an integrated memory 1 having a plurality of memory cell arrays. In the illustration according to FIG. 1, in this case only two memory cell arrays B1 and B2 are illustrated by way of example, the memory cell arrays each being subdivided into individual segments, separated by sense amplifier strips SA. Each of the memory cell arrays B1 and B2 in the form of so-called memory banks has word lines WL and bit lines BL. Memory cells MC are provided at crossover points between the bit lines BL and word lines WL. The memory cells MC are in each case connected to one of the word lines WL and one of the bit lines BL. They are selected via the respective word lines WL for a read or write operation. Via the bit lines BL a data signal is read from one of the memory cells MC or written to one of the memory cells.

The word lines WL are selected or activated via a row decoder 20. The row decoder 20 is connected to an addressing control signal $\overline{AS}$. The row decoder 20 is likewise connected to address lines, which are not illustrated in FIG. 1 for the sake of clarity.

The bit lines BL of each of the memory banks B1 and B2 are selected by respective assigned column decoders 11 and 12. By way of example, in each case all the bit lines BL along one of the word lines WL1 and WL2 are selected for a burst by the column decoders 11 and 12, respectively. For a memory cell access, to that end the relevant word line WL1 and WL2, respectively, is selected by the row decoder 20 and then the data along the respective word line are read out or written in via the respective bit lines under the control of the column decoders 11 and 12, respectively.

The integrated memory 1 in accordance with FIG. 1 additionally has a control circuit 2 in the form of a counter circuit (interleave counter), which is connected to the respective column decoders 11 and 12 and the row decoder 20. The control circuit 2 is furthermore connected to terminals for a read command $\overline{RD}$ and for a write command $\overline{WE}$.

Depending on a respective state of the read command $\overline{RD}$ or the write command $\overline{WE}$, the control circuit 2 generates control signals RDA for driving the column decoder 11. Moreover, depending on a state of the read command $\overline{RD}$ or the write command $\overline{WE}$, the control circuit 2 generates control signals RDB for driving the column decoder 12. Accordingly, row access control signals ACA and ACB, in each case intended for the memory bank B1 and B2, respectively, are fed from the control circuit 2 to the row decoder 20. In this case, the addressing of the word lines is dependent on the addressing control signal $\overline{AS}$. Addresses and data are applied, and data are taken, via data and address terminals AD. The operation of the memory 1 can be controlled in a synchronized manner through the use of a clock signal CK that is fed in.

Figure 2:
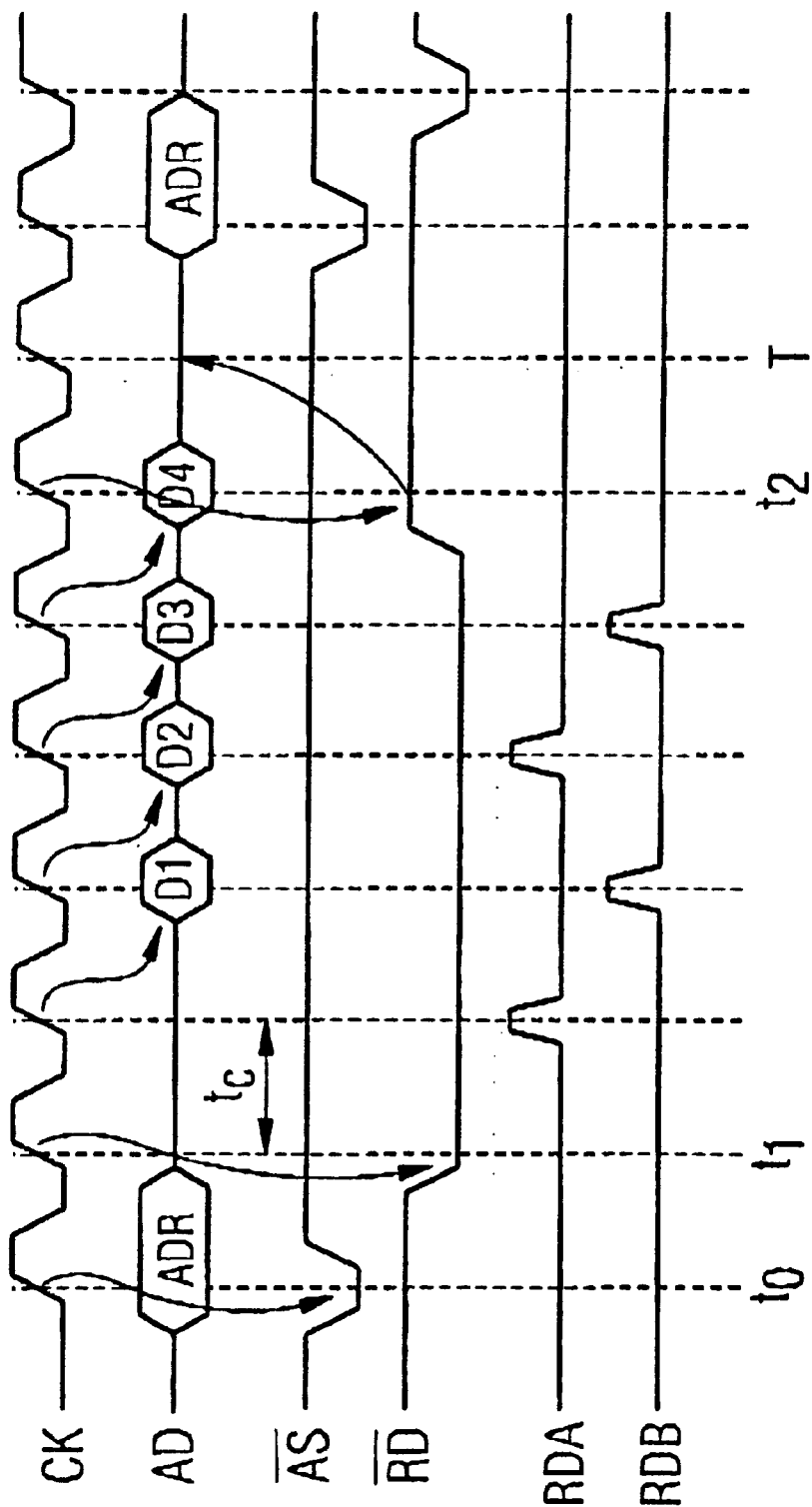
FIGS. 2 and 3 are timing diagrams for operating an integrated memory according to the invention.
Figure 3:
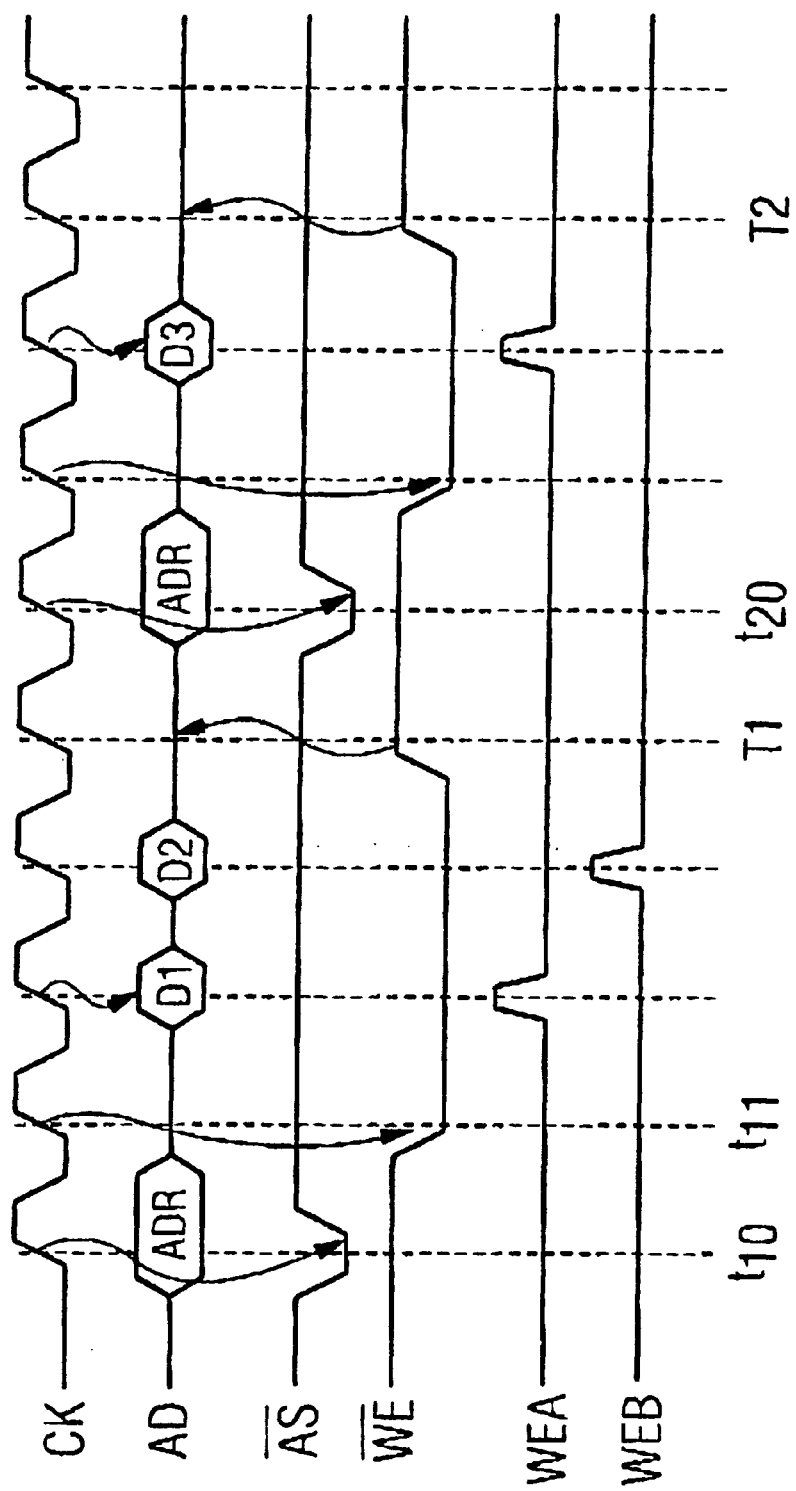

FIGS. 2 and 3 each illustrate a timing diagram for operation of an integrated memory in accordance with FIG. 1. A read access is explained in more detail with reference to FIG. 2 and a write access is explained in more detail with reference to FIG. 3.

At the beginning of a read access to memory cells MC of the memory bank B1, the addressing control signal $\overline{AS}$ is activated (active low). Under the control of the clock signal CK, the address ADR applied via the terminals AD is read in and stored (instant t0). Afterward, a read command $\overline{RD}$ is activated (active low), which is stored at the instant t1. After a programmable time tc, the reading control signals RDA and RDB are generated cyclically in an alternating manner.

Accordingly, the column decoders 11 and 12 are driven alternately by the reading control signal RDA and RDB. On account of the driving by the decoders 11 and 12, the data D1 to D4 of the memory blocks B1 and B2 are alternately read out successively from the memory banks B1 and B2. Thus, a burst is carried out over both memory banks of the memory 1. As a result, it is possible, for example, in each case to read all the memory cells along the word lines WL1 and WL2 in a burst.

In this case, the burst is carried out for as long as the read command $\overline{RD}$ remains in the active state. Once the read command $\overline{RD}$ has undergone transition into the inactive state, control signals RDA and RDB are no longer generated, as a result of which the burst is now ended. At the instant t2, a connected transfer bus (not illustrated) is put into a high-impedance state and the precharging is carried out for the corresponding lines. A read access cycle is thus concluded at the instant T.

With the read command $\overline{RD}$, it is thus possible to set a temporally variable burst length and to determine the burst length. With this functionality, it is possible, in principle, to carry out bursts of arbitrary length. As a result, a burst is no longer limited to the page length (word line length) of the memory. The memory banks B1 and B2 are driven externally in an invisible manner in multi-memory-bank operation. A burst over the entire memory 1 is thus made possible.

FIG. 3 shows a timing diagram for a write access analogous thereto. At the instant t10, the address ADR is read in and stored, under the control of the addressing control signal $\overline{AS}$. At the instant t11, the write command $\overline{WE}$ is read in and stored. The control circuit 2 again cyclically generates writing control signals WEA and WEB for the respective decoders 11 and 12. The data D1 and D2 of the memory banks B1 and B2 are thereupon transferred cyclically. The control signals WEA and WEB are generated for as long as the write command $\overline{WE}$ remains in the active state. As soon as the write command undergoes transition into an inactive state, the write access is ended (instant T1). A further write access is begun at the instant t20 and ended after the transfer of the data D3 at the instant T2. In this case, only the memory bank B1 is accessed.

In accordance with the reading control signals RDA and RDB or writing control signals WEA and WEB, the row access control signals ACA and ACB, in each case for the memory bank BD and B2 respectively, are generated in the same temporal order. The temporal order of the control signals can be changed to the effect that, instead of alternate driving of the memory banks B1 and B2, the memory banks are driven sequentially. In this case, the control circuit 2 contains a sequential counter circuit.

I claim:

1. An integrated memory, comprising:

a plurality of memory cell arrays each having memory cells, word lines for selecting said memory cells, and bit lines for one of reading data signals from said memory cells and writing data signals to said memory cells;

decoders assigned to respective ones of said memory cell arrays for selecting said bit lines and said word lines;

a terminal for selectively receiving a read command and a write command, the read command and the write command having a respective state;

a control circuit for controlling a memory cell access, said control circuit being connected to said decoders and to said terminal for selectively receiving a read command and a write command;

said control circuit generating, in dependence of the respective state of one of the read command and the write command, first control signals for driving one of said decoders assigned to one of said memory cell arrays and second control signals for driving a further one of said decoders assigned to a further one of said memory cell arrays within an access cycle; and said control circuit being configured such that a generation of the first and second control signals by said control circuit is terminated by one of the read command and the write command.

2. The integrated memory according to claim 1, wherein said control circuit includes a counter circuit driven by one of the write command and the read command.

3. The integrated memory according to claim 2, wherein said counter circuit generates the second control signals sequentially after the first control signals.

4. The integrated memory according to claim 2, wherein said counter circuit generates the first control signals and second control signals alternately.

5. A method for operating an integrated memory, the method which comprises:

providing an integrated memory having a plurality of memory cell arrays each having word lines for selecting memory cells and bit lines for selectively reading and writing data signals of the memory cells;

generating a command selected from the group consisting of a write command having an active state and a read command having an active state in order to trigger an access cycle for a memory cell access;

driving respective decoders of the memory cell arrays within the access cycle for the memory cell access; and one of successively reading data from each of the memory cell arrays and successively writing data to each of the memory cell arrays for as long as the command remains in the active state.

6. The method according to claim 5, which comprises, in a sequential order, initially one of reading data from and writing data to one of the memory cell arrays, and subsequently one of reading data from and writing data to a further one of the memory cell arrays.

7. The method according to claim 5, which comprises accessing, in an alternating order, two of the memory cell arrays for one of reading data from and writing data to the two of the memory cell arrays.

* * * * *